United States Patent [19]
Ahmed

[11] 3,937,987
[45] Feb. 10, 1976

[54] THRESHOLD DETECTOR

[75] Inventor: Adel Abdel Aziz Ahmed, Annandale, N.J.

[73] Assignee: RCA Corporation, New York, N.Y.

[22] Filed: Apr. 11, 1974

[21] Appl. No.: 459,954

[52] U.S. Cl............ 307/235 W; 307/254; 307/296; 323/4
[51] Int. Cl.² .................... H03K 5/20; H03K 17/60
[58] Field of Search............ 307/235 R, 254, 296-7 307/318; 323/4

[56] References Cited
UNITED STATES PATENTS
3,656,007   4/1972   Murray........................... 307/318 X

*Primary Examiner*—John Zazworsky
*Attorney, Agent, or Firm*—H. Christoffersen; Samuel Cohen; Frank R. Perillo

[57] ABSTRACT

Two transistors, the emitter of the first joined to the collector of the second via a resistor and two bases joined by an element such as a diode. When the input signal applied to the base electrode of the first transistor is less than a given value, neither transistor conducts; when it exceeds a second value close to this given value, substantially constant voltages develop across the diode and resistor, respectively, and the two transistors conduct a constant current.

9 Claims, 3 Drawing Figures

THRESHOLD DETECTOR

Relatively complex circuitry has been required to realize the following features in a solid-state switch: the switch preferably should draw no current while in its off state, it must switch when the switching command reaches a predetermined threshold, the transition from off to on must be relatively abrupt; the output current must be relatively constant and independent of power supply variations.

The circuits of the present invention are easily implemented threshold switches that can have zero stand-by power consumption and controlled output current. They may be realized using first and second transistors, a resistive means between the emitter of the first and the collector of the second, and means providing a substantially fixed offset potential between the bases of the two transistors in response to an input signal of greater than a given amplitude applied to the base of the first transistor.

The invention is discussed in greater detail below and illustrated in the drawing of which:

Figure 1:
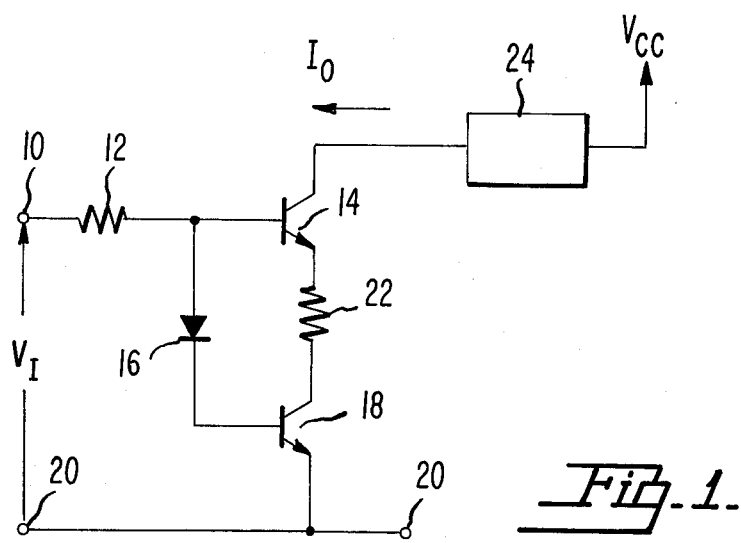
FIG. 1 is a schematic circuit diagram of a preferred embodiment of the invention.

In FIG. 1, input terminal 10 is connected to the base terminal of transistor 14 through resistor 12. This base terminal is also connected through diode 16 to the base terminal of transistor 18. The emitter of transistor 18 is connected to terminal 20 which is common to the output and input. The collector of transistor 18 is connected through resistor 22 to the emitter of transistor 14 while the collector of the latter transistor is connected through an arbitrary load 24 to a positive potential $V_{CC}$.

With zero potential across input terminals 10–20, the load current $I_0$ is zero. As the input voltage $V_I$ is increased from zero volts, the output current remains at zero until the threshold potential of the switch is reached. For the preferred embodiment, this threshold potential is the threshold potential of diode 16 plus the threshold potential of transistor 18. Diode 16 and transistor 18 (as well as transistor 14) are silicon devices. The threshold voltage for each device is essentially equal and equals the voltage drop $V_F$ across a forward-biased silicon diode when it just begins to conduct current (about 500 millivolts).

When the input voltage exceeds $2V_F$, transistors 14 and 18 begin to conduct. The threshold voltage is shown at 25 in FIG. 2. As the input voltage is increased over the range 25–26, the output current also increases. When the input voltage reaches point 26, the output current is at its maximum value and this current remains essentially constant for further increases in $V_I$.

Constant current operation is realized by maintaining a constant potential across resistor 22. The terminal of resistor 22 connected to the emitter of transistor 14 is maintained at a constant potential by the clamping circuit formed by resistor 12, diode 16 and the base-emitter diode of transistor 18. The clamping circuit limits the maximum excursion of input voltage $V_I$ that is applied to the base of transistor 14 to the value of the clamping voltage. This substantially constant base voltage equals ($V_{16}+V_{be18}$), where $V_{16}$ is the voltage across diode 16 and $V_{be18}$ is the voltage across the base-emitter junction of transistor 18. The voltage at the emitter electrode of transistor 14 is ($V_{16}+V_{be18}-V_{be14}$), where $V_{be14}$ is the voltage across the base-emitter junction of transistor 14. The remaining terminal of resistor 22 is maintained at the collector-to-emitter voltage $V_{ce18}$ of transistor 18. This transistor is driven into saturation when $V_I$ reaches the voltage corresponding to 26 in FIG. 2, causing $V_{ce18}$ to become essentially constant over a wide range of collector current.

The voltage across resistor 22 equals the emitter voltage of transistor 14 minus the collector voltage of transistor 18, both measured with respect to the common terminal. A particular value of constant output current, 28 in FIG. 2, can be realized by dividing the voltage across resistor 22 by the desired value of output current thereby determining the required resistance value of resistor 22.

It should be mentioned at this point that the circuit of FIG. 1 produces an output current that is only approximately constant. With an actual physical implementation of the circuit, the region 28 in FIG. 2 will not be horizontal as shown, but will instead have a positive slope. While this slope is small with respect to the slope of the region 25–26, there will be a slight increase in output current for increases in input voltage. There are two major sources of this current increase. The first is the non-ideal characteristics of p-n junctions. Ideally, the current through such a junction would be zero until the threshold voltage $V_F$ was reached and the device began to conduct current. In the ideal case, the junction voltage would remain constant for all values of current through the diode. Actual diodes will begin to conduct current at a voltage $V_F$ but the junction voltage increases with increasing current flow. As the diode current increases, however, a particular incremental increase in current will produce a smaller incremental increase in voltage.

In the present circuit, where the voltage needed to produce a constant output current is derived, in part, from the voltage across diode 16 and the base-emitter junctions of transistors 14 and 18, it is clear that an increase in input voltage $V_I$ will increase the current through these devices. This will increase the junction voltage drops and tend to increase the voltage across resistor 22, increasing the output current.

A second source of output current increase is the increase in the base-emitter voltage drop of transistor 18 when it is driven into saturation. This voltage increase is due, in addition to the increase in junction voltage, to the voltage drop caused by the resistivity of the transistor base material. This voltage will be discussed more fully in connection with the circuit of FIG. 3.

Figure 3:
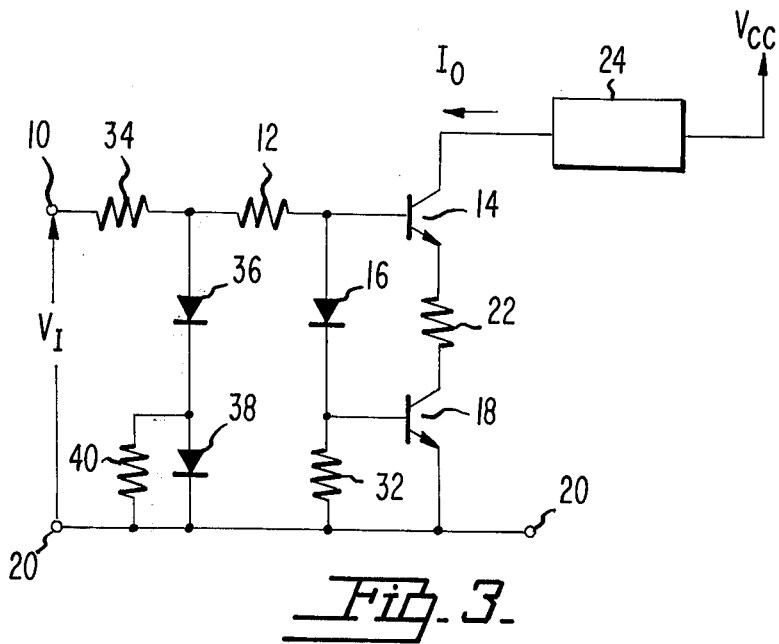
FIG. 3 is a schematic circuit diagram of a second embodiment of the invention.

The circuit of FIG. 3 is a modification of the circuit of FIG. 1. Components common to this circuit and the circuit of FIG. 1 are identified by the same reference numbers. A resistor 32 is added connecting the base of transistor 18 to the common terminal. Resistor 34 connects input terminal 10 to resistor 12. Diodes 36 and 38 are essentially serially connected between the connection between resistors 34 and 12 and the common terminal, while resistor 40 is connected across diode 38.

Figure 2:
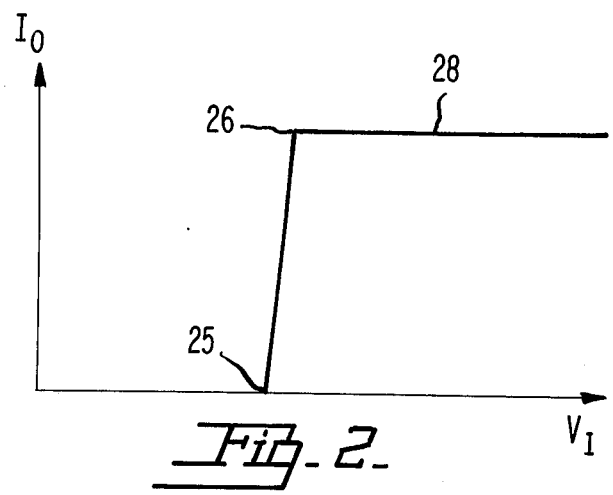
FIG. 2 illustrates the switching characteristics of the circuit of FIG. 1.

The addition of resistor 32 reduces the width of region 25–26 in FIG. 2, thereby enabling the switch to reach its maximum current value with a smaller change in input voltage than the switch of FIG. 1. In FIG. 1, as $V_I$ reaches $2V_F$, the threshold voltage of the switch, diode 16 and transistor 18 begin to conduct. An increase in $V_I$, $\Delta V_I$ will increase the voltage drop across each p-n junction by an amount $\Delta V_F$, resulting in an increased current flow into the base of transistor 18. Since the two p-n junctions are in series, the effect of a change in input voltage $\Delta V_I$ upon the operation of transistor 18 is less than would occur if $\Delta V_I$ were applied directly across the base-emitter terminals of 18.

In other words, the presence of diode 16 requires that a greater change in input voltage be applied to the switch input to increase the base current of transistor 18 to the point where saturation of the device occurs, that is, the effect of the diode in series with the base emitter junction of transistor 18 is to reduce the overall gain of the switch in region 25–26.

The addition of resistor 32 reduces the gain reduction effects of diode 16. Resistor 32 is chosen in value such that the current through it necessary to produce the voltage $V_F$ across the base emitter junction of transistor 18 is much larger, for example greater by a factor of ten, than the base current necessary to saturate transistor 18.

Quiescently, that is, when $V_I = 0$, there is zero power consumption, just as in the FIG. 1 circuit. As the input voltage is increased from zero volts, diode 16 will begin to conduct current through resistor 32 before transistor 18 becomes conductive. In this sense there is now some power consumption, that is, current flows via path 10, 12, 16, 32 prior to the time transistors 18 and 14 start to conduct (which is not the case in the FIG. 1 circuit).

When the input voltage is increased to the point where the voltage drop across resistor 32 equals $V_F$, transistor 18 will begin to draw base current. At this instant of operation, diode 16 is conducting a current far in excess of the transistor 18 base current. As the input voltage is further increased, the current through diode 16 increases. This increase, however, corresponds only to a small percentage of the current already flowing in diode 16. The base current of transistor 18 increases appreciably, driving the transistor towards saturation. The reason for this abrupt increase is that as the operating point of the base-emitter junction moves from the essentially constant current region of its characteristic to the bend in the characteristic and toward the constant voltage region of the characteristic, the junction's dynamic resistance rapidly changes from a value much higher than that of resistor 32 to one much lower than that of resistor 32. The current which initially flows in its entirety into this resistor is now steered almost entirely into the base of transistor 18, rapidly driving it into saturation and substantially reducing the width of the region between points 25 and 26 in FIG. 2. Thus, a much smaller change in input voltage $V_I$ is needed, once point 25 is reached, to cause a given change in output current in the FIG. 3 circuit than in the FIG. 1 circuit and in this sense the gain of the circuit is very substantially increased (at a cost of a small additional amount of power). Because this additional power is supplied from the input source, rather than from the $V_{CC}$ source, it is a power loss that occurs only when the input source is energized. The switch still consumes no power when the input voltage is less than the voltage $V_F$.

Looked at another way, at the relatively high current flow through diode 16 just proir to the switching of transistor 18, this diode is operating in its substantially constant voltage region, that is, its forward voltage drop, remains essentially constant as transistor 18 is driven from cutoff towards saturation. The voltage divider effect of the two p-n junctions discussed earlier is thereby avoided, circuit gain is increased and the width of region 26–26 in FIG. 2 becomes narrower. The circuit threshold voltage, 25 in FIG. 2, is slightly increased by the addition of resistor 32, This is due to the higher forward voltage drop across diode 16 because of the increased current flow through it when resistor 32 is present.

If desired, the circuit of FIG. 3 can be made more sensitive to the input signal by quiescently biasing it at some voltage level $V_I'$ such that substantial current flows through diode 16 and resistor 32 but with transistor 18 still not conducting any base current, that is, still cut off. However, doing this is at the expense of power consumption and in many applications would not be desired. The circuit can also be made more sensitive by quiescently biasing it at a lower level, somewhat under $V_F$, such that the diode 16 has not yet begun to conduct. Similarly, the FIG. 1 circuit can be quiescently biased closer to point 25 of FIG. 2 to make it more sensitive to input signal. This can be accomplished with no increase in quiescent power consumption.

Resistors 34 and 40, and diodes 36 and 38 are added to minimize the effects of the earlier mentioned increase in voltage at the base of transistor 18 when, as the base current is increased, the transistor is operated in its saturation mode. The above-identified components are not necessary for the switching function and may be eliminated if desired. If eliminated, the circuit of FIG. 3 would then be identical, except for the addition of resistor 32, to the circuit of FIG. 1.

When a transistor is driven into saturation, there is a substantial increase in the base current required to maintain a particular collector current level. This is because the current gain of a transistor decreases significantly when the transistor saturates. As this increased current flows through the base region, an appreciable voltage drop may occur in this base region due to the resistance of the material comprising the base. The voltage is not to be confused with the voltage across the base-emitter junction. This increase in base voltage will cause an increase in potential at the resistor 22 terminal connected to the emitter of transistor 14, causing an increase in output current. To avoid this effect, the network including resistors 34, 40 and diodes 36, 38 may be used. This network will clamp the input voltage level, thereby limiting the current flow into the base of transistor 18 and avoiding the above described effect.

Resistor 40 is chosen such that the current through diode 36 is high compared to the current through diode 16. This higher current ensures that the voltage across diodes 36, 38 is greater than the voltage across the anode terminal of diode 16 and terminal 20. The clamping will thus be large enough to allow normal switching action to occur while avoiding an undesirable voltage drop across the base-emitter terminals of transistor 18.

An alternative technique for ensuring that the clamping voltage amplitude is adequate for normal switching action is to fabricate diode 16 such that its junction area is larger than the junction areas of diodes 36 and 38. This reduces the forward voltage drop across diode 16 relative to the smaller diodes for a given current level, thereby eliminating the need for resistor 40.

While the threshold voltage was realized, in part, in the preferred embodiment by the voltage drop across diode 16, it should be mentioned that this device can be replaced by other threshold elements. For example, an increased threshold voltage would be realized by replacing diode 16 with several forward biased diodes in series. Further, these diodes could be realized by using transistors connected in a diode configuration. The threshold element could also be a reverse biased avalanche diode.

A circuit such as shown in FIG. 3 may have the following resistance values: resistors 34 and 12, 1000 ohms; resistors 22 and 40, 700 ohms; resistor 32, 6000 ohms. Transistors 14 and 18 and diodes 16, 36 and 38 may be realized in integrated circuit form, the diodes being transistors operated with their base-collector electrodes connected together.

What is claimed is:

1. A threshold switch comprising:
   input, output and common terminals;
   first and second transistors, each having a base and an emitter and a collector electrode, said first transistor collector electrode being connected to said output terminal and said second transistor emitter electrode being connected to said common terminal;
   a first resistive element connected between said first transistor emitter electrode and said second transistor collector electrode;
   a second resistive element connected between said input terminal and said first transistor base electrode;
   means with first and second terminals for providing a substantially fixed offset potential responsive to current flow having a range of values between its first and second terminals;
   negligible direct current impedance means connecting said first terminal to said base electrode of said first transistor; and
   negligible direct current impedance means connecting said second terminal to the base electrode of said second transistor.

2. A threshold switch as set forth in claim 1 further including:
   a third resistive element connected between the base and the emitter electrodes of said second transistor.

3. A threshold switch as set forth in claim 1 wherein said means for providing an offset potential comprises a diode.

4. A threshold switch as set forth in claim 1 wherein said second resistive element is subdivided into two portions serially connected to each other at a point of interconnection and further including:
   clamping means connected between said point of interconnection and said common terminal for limiting the maximum value of potential appearing between said point of interconnection and said common terminal.

5. A threshold switch as set forth in claim 4 wherein said clamping means includes a plurality of serially connected diodes.

6. A threshold switch as claimed in claim 4 wherein said means for providing an offset potential comprises solely a single diode, and further including:
   a third resistor element connected between the base and emitter electrodes of said second transistor;
   second and third diodes serially connected between said point of interconnection and said common terminal to form a part of said clamping means; and
   a fourth resistive element connected in parallel with said second diode.

7. In combination:
   first and second transistors, each having base, emitter and collector electrodes, the first transistor connected at its collector electrode to an output terminal and the second connected at its emitter electrode to a point of reference potential;
   resistive means connected between the collector electrode of said second transistor and the emitter electrode of said first transistor; and
   means connected to the base electrode of said first transistor and responsive to a signal having a range of values applied thereto of greater than a given value for establishing a relatively constant difference in potential between said first and second base electrodes and a sufficient flow of base current into said second transistor for driving the same into saturation.

8. In the combination as set forth in claim 7, said last-named means comprising a diode connected in the forward direction with respect to the flow of base current in said second transistor, between the two base electrodes.

9. In the combination as set forth in claim 8, further including a resistor connected between the base and emitter electrodes of said second transistor and having a value such that the current flow through it for developing a voltage equal to the threshold voltage of the base-emitter junction of said second transistor is substantially greater than the base current required to drive said second transistor to saturation.

* * * * *